(12) United States Patent
Itagaki et al.

(10) Patent No.: US 6,559,541 B2
(45) Date of Patent: May 6, 2003

(54) CONNECTION STRUCTURE FOR SEMICONDUCTOR ELECTRODE TERMINALS

(75) Inventors: Masamitsu Itagaki, Kanuma (JP); Hiroyuki Fujihira, Kanuma (JP)

(73) Assignee: Sony Chemicals Corporation, Tokyo (JP)

( * ) Notice: Subject to any disclaimer, the term of this patent is extended or adjusted under 35 U.S.C. 154(b) by 0 days.

(21) Appl. No.: 09/862,503

(22) Filed: May 23, 2001

(65) Prior Publication Data
US 2002/0008321 A1 Jan. 24, 2002

(30) Foreign Application Priority Data
May 30, 2000 (JP) ........................................ 2000-160039

(51) Int. Cl.[7] .............................................. H01L 29/40
(52) U.S. Cl. ................... 257/738; 257/701; 257/737; 257/773; 257/775; 257/787; 257/788; 257/789; 257/795; 257/692; 257/698

(58) Field of Search .................................... 257/692, 693, 257/698, 700, 701, 734, 737, 738, 758, 773, 775, 778, 787, 788, 789, 795

(56) References Cited

U.S. PATENT DOCUMENTS 5,404,025 A * 4/1995 Yamada ........................ 257/10
5,804,882 A * 9/1998 Tsukagoshi et al. ........ 257/690

* cited by examiner

Primary Examiner—Nathan J. Flynn
Assistant Examiner—Pershelle Greene
(74) Attorney, Agent, or Firm—Oliff & Berridge, PLC

(57) ABSTRACT

A connection structure is configured such that electrodes formed on an overcoat layer on a substrate are connected to other electrode terminals using an anisotropically electroconductive adhesive 30 comprising electroconductive particles dispersed in an insulating adhesive, wherein the angle of encroachment A of the electroconductive particles 32 into the overcoat layer 4 is made to be at least 135°.

7 Claims, 3 Drawing Sheets

CONNECTION STRUCTURE FOR SEMICONDUCTOR ELECTRODE TERMINALS

BACKGROUND OF THE INVENTION

1. Field of the Invention

The present invention relates to a connection structure in which electrodes that are made of indium-tin-oxide (ITO) or the like and are formed on an overcoat layer on a substrate are connected to other electrode terminals using an anisotropically electroconductive adhesive.

2. Description of the Related Art

As shown in FIG. 3, broadly speaking a liquid crystal panel 1 of a Super-Twisted Nematic (STN) color liquid crystal display or the like has a structure in which: a lower substrate 6—in which color filters 3 are formed on a glass substrate 2, an overcoat layer 4 is formed on top of these color filters, the surface is flattened, and lateral-stripe-like electrodes 5 made of ITO are formed on top of the overcoat layer 4—and an upper structure 9—in which longitudinal-stripe-like electrodes 8 made of ITO are formed on another glass substrate 7—are placed one on top of the other in such a way that the electrodes 5 and 8 of the lower and upper substrates form a lattice shape; the peripheral parts are sealed with a sealant 10; and liquid crystals 11 are held between the lower substrate 6 and the upper substrate 9.

The electrodes 5 of the liquid crystal panel 1 are connected to the electrode terminals 21 of the circuit board 20 of a tape carrier package (TCP) or the like by means of an anisotropically electro-conductive adhesive 30.

The anisotropically electroconductive adhesive 30 generally comprises electroconductive particles 32 dispersed in an insulating adhesive 31. In order to obtain highly reliable electrical continuity, a material of relatively high elasticity is used for the electroconductive particles 32. However, if electroconductive particles 32 of high elasticity are used with the ITO electrodes 5 on the overcoat layer 4, then cracks appear in the electrodes 5; a relatively soft material such as a styrene material or an acrylic material is thus used for the electroconductive particles 32.

However, even if a relatively soft material is used for the electroconductive particles 32, in the case that the overcoat layer 4 is thick (i.e. around 3 to 7 $\mu$m), when the electrodes 5 on the overcoat layer 4 are connected to the electrode terminals 21 of the circuit board 20 by means of the anisotropically electroconductive adhesive 30, the electroconductive particles 32 encroach into the overcoat layer 4 as shown in FIG. 4, meaning that cracks still appear in the electrodes 5 on the overcoat layer, resulting in the problem of electrical connection becoming less reliable.

SUMMARY OF THE INVENTION

The present invention aims to resolve problems of conventional art such as the problem described above. Specifically, an object of the present invention is, in a connection structure in which electrodes on an overcoat layer are connected to other electrode terminals using an anisotropically electroconductive adhesive, to prevent cracks from appearing in the electrodes on the overcoat layer, thus improving the reliability of electrical connection, this being both when the electro-conductive particles in the anisotropically electro-conductive adhesive have a high elastic modulus and when the overcoat layer is thick.

The present invention has been accomplished when the inventors discovered that cracking of the electrodes on the overcoat layer can be prevented—and hence reliable electrical connection can be obtained—by optimizing the angle between the surface of the overcoat layer and the surface of an electro-conductive particle, where this angle depends on the extent to which the electroconductive particles are pushed into the overcoat layer.

Specifically, the present invention provides a connection structure configured such that electrodes formed on an overcoat layer on a substrate are connected to other electrode terminals using an anisotropically electroconductive adhesive comprising electroconductive particles dispersed in an insulating adhesive, wherein the 'angle of encroachment' of the electroconductive particles into the overcoat layer is at least 135°.

Here, the 'angle of encroachment' of the electroconductive particles into the overcoat layer refers to the angle A shown in FIGS. 1A to 1F and FIGS. 2A to 2E, namely the angle between (a) the tangent to the surface of an electroconductive particle 32 and (b) the surface of the overcoat layer 4, at the point where the electroconductive particle 32 and the surface of the overcoat layer 4 intersect. Moreover, with the present invention, the angle of encroachment A is not actually measured by, for example, looking at the connection structure through a microscope, but rather is determined from the particle diameter of the electroconductive particles 32 and the thickness of the overcoat layer 4, assuming that in the connection structure the electroconductive particles are pushed in as far as the lower surface of the overcoat layer 4 (i.e. as far as the surface of the substrate 2).

DESCRIPTION OF THE PREFERRED EMBODIMENTS

The present invention is described in detail below with reference to the drawings. Note that the same reference number represents the same or equivalent constituent elements in each of the Figures.

Figure 1A:
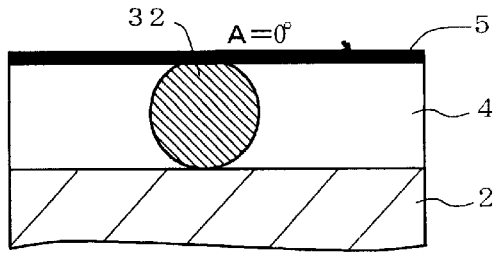
FIGS. 1A to 1F are conceptual diagrams of the angle of encroachment for the connection structure.
Figure 1B:
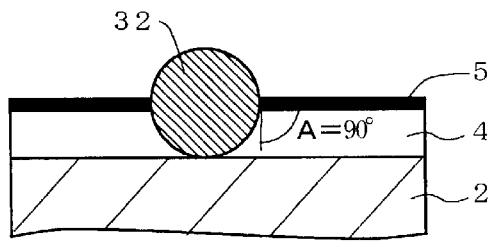
Figure 1C:
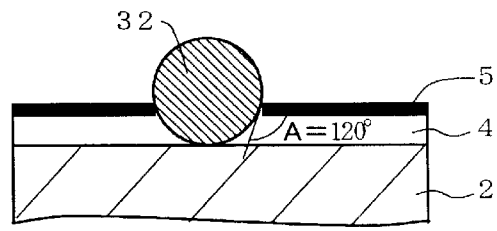
Figure 1D:
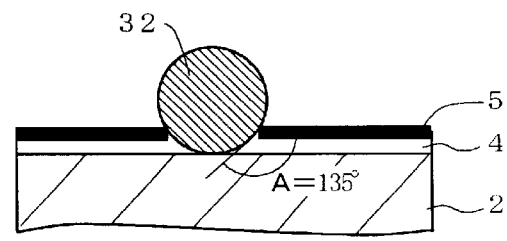
Figure 1E:
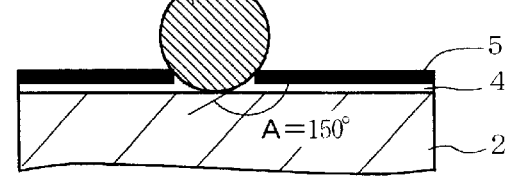
Figure 1F:
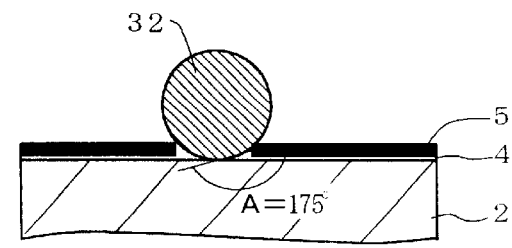
Figure 2A:
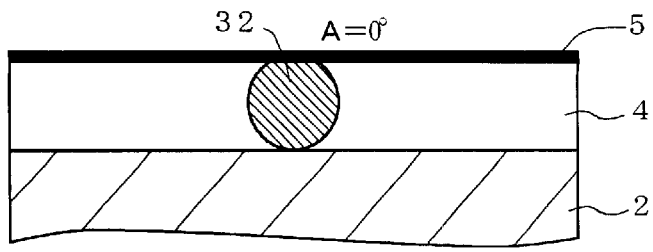
FIGS. 2A to 2E are conceptual diagrams of the angle of encroachment for the connection structure.
Figure 2B:
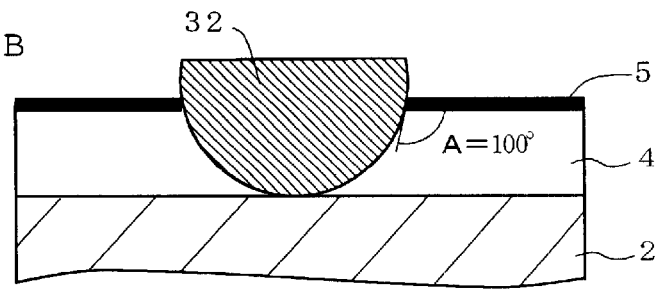
Figure 2C:
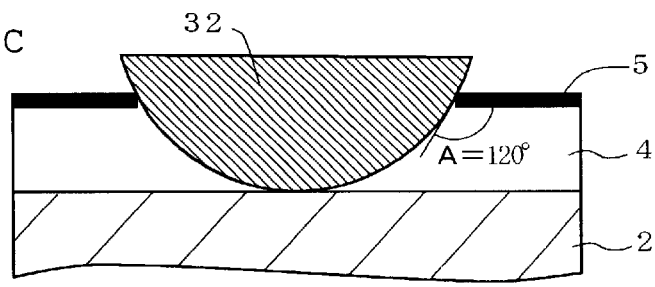
Figure 2D:
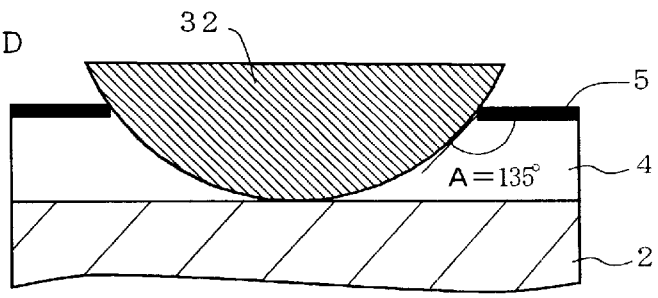
Figure 2E:
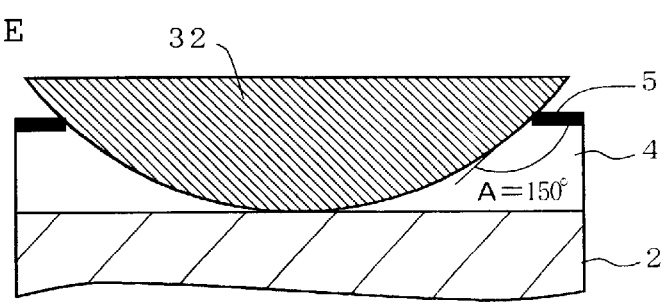
Figure 3:
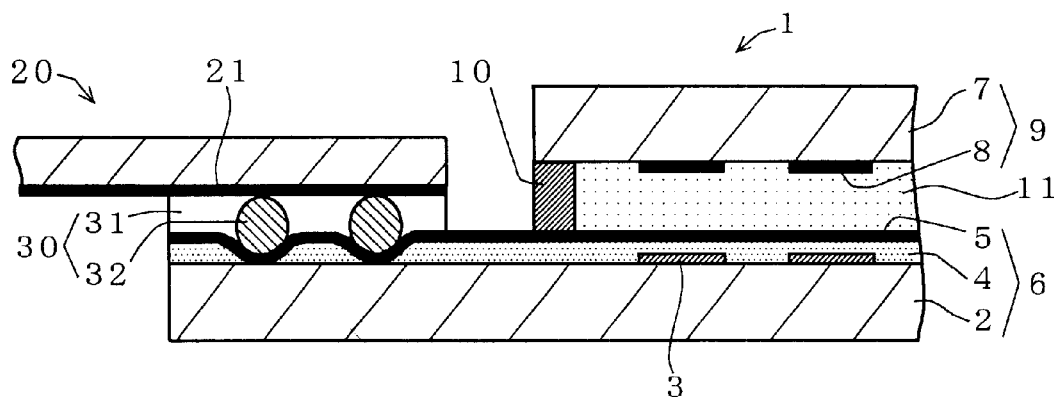
FIG. 3 is a cross-sectional diagram of the connection structure between a transparent electrode and the TCP of a liquid crystal display.
Figure 4:
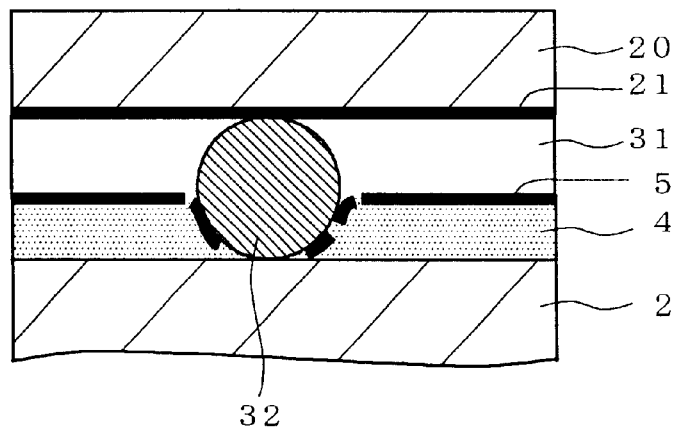
FIG. 4 is a cross-sectional diagram of a conventional connection structure for which a crack has appeared in an electrode.

An example of the connection structure of the present invention is shown in FIG. 3. With this connection structure, electrodes 5, which are made of ITO and are formed on an overcoat layer 4 on a glass substrate 2 of a liquid crystal panel 1 of an STN color liquid crystal display, are connected to TCP electrode terminals 21 using an anisotropically electroconductive adhesive 30, and the angle of encroachment of the electroconductive particles 32 into the overcoat layer 4 is at least 135°.

The actual angle of encroachment A of the connection structure will depend on factors such as the hardness and particle diameter of the electro-conductive particles 32, the hardness and thickness of the overcoat layer 4, the hardness and thickness of the electrodes 5, and the contact bonding conditions. With the present invention, however, these factors are not considered and the angle of encroachment A is instead specified to be the value determined from the particle diameter of the electroconductive particles 32 and the thickness of the overcoat layer 4, for example by drawing a diagram. If the angle of encroachment A as calculated from the particle diameter of the electroconductive particles 32 and the thickness of the overcoat layer 4 is less than 135°, then cracks appear in the electrodes 5 on the overcoat layer 4, making it hard to achieve reliable electrical connection. The angle of encroachment A is thus preferably made to be in the range 135° to 180°. Note that when the angle of encroachment A is 180°, it would appear from a diagram that each electro-conductive particle 32 touches an electrode 5 at a single point, but in practice the electroconductive particles 32 deform and so each touches an electrode 5 over an area, meaning that reliable electrical continuity can still be obtained.

When the angle of encroachment A is 135° or more, D/L is 5/1 or more, where D is the particle diameter of the electroconductive particles and L is the thickness of the overcoat layer.

With the connection structure of the present invention, the angle of encroachment A of the electroconductive particles into the overcoat layer is made to be at least 135°, but other than this there are no particular restrictions regarding things like the types of the insulating adhesive and the electroconductive particles that make up the anisotropically electroconductive adhesive, the types of substrates that are connected using the anisotropically electroconductive adhesive, or the material from which the overcoat layer is made.

For example, the insulating adhesive in the anisotropically electroconductive adhesive can be a thermosetting or photocurable resin such as an epoxy resin, a urethane resin or an unsaturated polyester resin; things that can be used as the electro-conductive particles include metallic particles such as solder particles or nickel particles, metal-plated resin-core particles in which a metal plating is formed on the surface of a resin core made of styrene resin or the like, and composite particles in which an inorganic powder of silica or the like is thermochemically adhered around a resin core and then further a metal plating is formed.

The anisotropically electroconductive adhesive may be in the form of either a film or a paste.

The overcoat layer can be something like a publicly-known acrylic or polyimide overcoat layer.

The other electrode terminals that are connected to the electrodes on the overcoat layer are not restricted to being the electrode terminals of a TCP, but can also for example be something like the electrode terminals of an IC chip.

EXAMPLES

Experimental Example 1

Acrylic resin overcoat layers of the 6 thicknesses A to F shown in Table 1 were each formed on a glass substrate, and ITO electrodes (ITO thickness 18 μm) were formed across the whole of each overcoat layer. The ITO electrodes were connected to Sn-plated Cu electrode terminals (terminal thickness 18 μm) formed on a TCP substrate using an anisotropically electroconductive adhesive film (connection conditions: temperature 170° C., pressure 3 MPa), thus obtaining connection structures. The following composition was used for the anisotropically electroconductive adhesive film.

Composition of the Anisotropically Electroconductive Adhesive Film

Latent curing agent (Asahi-Ciba product HX3941HP): 60 parts by weight

Bisphenol A type epoxy resin (Yuka-Shell product EP-1009): 36 parts by weight

Epoxysilane coupling agent (Nippon Unicar product A187): 1.9 parts by weight

Electroconductive particles (benzoguanamine resin core, with an Ni plating layer formed on top of it, and then an Au plating layer formed on top of this; particle diameter 5 μm): 2.1 parts by weight The angles of encroachment of the electroconductive particles for the various overcoat layer thicknesses are shown in Table 1. Conceptual diagrams of the angle of encroachment A as determined from the overcoat layer thickness and the particle diameter of the electroconductive particles are shown in FIGS. 1A to 1F. The reliability of electrical continuity and the extent of ITO electrode cracking for the connection structures obtained were evaluated as below; the results are shown in Table 1. It can be seen from Table 1 that it is possible to achieve sufficiently reliable electrical connection by making the angle of encroachment A be 135° or more.

(1) Evaluation of the Reliability of Electrical Continuity

The resistance between the ITO electrodes 5 of each connection structure and the facing electrode terminals was measured, and the reliability of electrical continuity was evaluated in accordance with the resistance as follows.

Excellent: 5Ω or less

Good: 10Ω or less

Fair: 20Ω or less

Poor: More than 20Ω

(2) Evaluation of ITO Cracking

The TCP substrate was stripped from each connection structure, and the extent of ITO cracking was observed using a scanning electron microscope and evaluated as follows.

Excellent: No cracking

Good: Virtually no cracking

Fair: A little cracking

Poor: Cracking across the entire surface

TABLE 1

| | Angle of encroach-ment A | Particle diameter D (μm) | Overcoat layer thickness L (μm) | D/L | Reliability of electrical connection | ITO cracking |
| --- | --- | --- | --- | --- | --- | --- |
| A | 0° | 5 | 5 | 1 | Poor | Poor |
| B | 90° | 5 | 2.5 | 2 | Poor | Poor |
| C | 120° | 5 | 1.7 | 3 | Poor | Poor |
| D | 135° | 5 | 1.25 | 4 | Fair | Fair |
| E | 150° | 5 | 1 | 5 | Excellent | Excellent |
| F | 175° | 5 | 0.8 | 6.25 | Excellent | Excellent |

Experimental Example 2

Connection structures like those of Experimental Example 1 were produced, only this time the particle diameter of the electroconductive particles 32 in the anisotropically electro-conductive adhesive film was changed to 5 different values A to E as shown in Table 2 while keeping the thickness of the overcoat layer 4 fixed at 2 μm. Conceptual diagrams of the angle of encroachment A are shown in FIGS. 2A to 2E. The reliability of electrical continuity and the extent of ITO electrode cracking for the connection structures obtained were evaluated as for Experimental Example 1; the results are shown in Table 2. It can be seen from Table 2 that it is possible to achieve sufficiently reliable electrical connection by making the angle of encroachment A be 135° or more.

TABLE 2

| | Angle of encroach-ment A | Particle diameter D (μm) | Overcoat layer thickness L (μm) | D/L | Reliability of electrical connection | ITO cracking |
|---|---|---|---|---|---|---|
| A | 0° | 2 | 2 | 1 | Poor | Poor |
| B | 100° | 5 | 2 | 2.5 | Poor | Poor |
| C | 120° | 8 | 2 | 4 | Fair | Fair |
| D | 135° | 10 | 2 | 5 | Good | Good |
| E | 150° | 15 | 2 | 7.5 | Excellent | Excellent |

With the present invention, in a connection structure in which electrodes on an overcoat layer are connected to other electrode terminals using an anisotropically electroconductive adhesive, the angle of encroachment of the electroconductive particles of the anisotropically electroconductive adhesive into the overcoat layer is made to be at least a certain size, meaning that highly reliable electrical connection can be achieved.

The entire disclosure of the specification, claims, summary and drawings of Japanese Patent Application No. 2000-160039 filed May 30, 2000 are hereby incorporated by reference.

What is claimed is:

1. A connection structure configured such that electrodes formed on an overcoat layer on a substrate are connected to other electrode terminals using an anisotropically electroconductive adhesive comprising electroconductive particles dispersed in an insulating adhesive, wherein the angle of encroachment of the electroconductive particles into the overcoat layer is at least 135°.

2. The connection structure according to claim 1, wherein the angle of encroachment of the electroconductive particles into the overcoat layer is in the range 135° to approaching 180°.

3. The connection structure according to claim 1, wherein the particle diameter of the electroconductive particles is at least 5 times the thickness of the overcoat layer.

4. The connection structure according to claim 1, wherein the electrodes on the overcoat layer are made of ITO.

5. The connection structure according to claim 2, wherein the particle diameter of the electroconductive particles is at least 5 times the thickness of the overcoat layer.

6. The connection structure according to claim 2, wherein the electrodes on the overcoat layer are made of ITO.

7. The connection structure according to claim 3, wherein the electrodes on the overcoat layer are made of ITO.

* * * * *